United States Patent
Alper et al.

(10) Patent No.: US 6,390,767 B1
(45) Date of Patent: May 21, 2002

(54) POSITIONING ASSEMBLY

(75) Inventors: Yoav Alper, Rishon le Zion; Beniamin Shulman, Rehovot, both of (IL)

(73) Assignee: Nova Measuring Instruments Ltd., Rehovot (IL)

( * ) Notice: Subject to any disclaimer, the term of this patent is extended or adjusted under 35 U.S.C. 154(b) by 0 days.

(21) Appl. No.: 09/521,938

(22) Filed: Mar. 9, 2000

(30) Foreign Application Priority Data

Mar. 10, 1999 (IL) ................................. 128925

(51) Int. Cl.$^7$ ............................................. B65G 49/07
(52) U.S. Cl. ....................................... 414/936; 414/941
(58) Field of Search ................... 414/757, 936, 414/941, 935

(56) References Cited

U.S. PATENT DOCUMENTS

| | | | |
|---|---|---|---|
| 5,171,031 A | 12/1992 | Nishiyama | 279/133 |
| 5,566,466 A * | 10/1996 | Hearne | 414/936 |
| 5,700,046 A * | 12/1997 | Van Doren et al. | 414/941 |
| 5,851,041 A * | 12/1998 | Anderson et al. | 414/941 |
| 6,099,643 A * | 8/2000 | Ohtani et al. | 414/941 |
| 6,174,011 B1 * | 1/2001 | Keigler | 414/941 |
| 6,267,423 B1 * | 7/2001 | Marohl et al. | 414/941 |
| 6,273,484 B1 * | 8/2001 | Peng | 414/941 |

FOREIGN PATENT DOCUMENTS

JP 62-295839 * 12/1987 ................. 414/941

* cited by examiner

*Primary Examiner*—H. Grant Skaggs
(74) *Attorney, Agent, or Firm*—Nath & Associates PLLC; Gary M. Nath; Marvin C. Berkowitz

(57) ABSTRACT

A positioning assembly is presented for positioning a substantially disk-shaped workpiece in a registered position. The positioning assembly comprises spaced-apart guiding members defining a common support plane for supporting the workpiece, such that they engage the circumference of the workpiece at spaced-apart locations. Each guiding member is mounted for pivotal movement in the support plane between its two extreme positions. The movements of the guiding members transport the workpiece towards the registered position.

10 Claims, 8 Drawing Sheets

SECTION A-A

SECTION A-A

POSITIONING ASSEMBLY

FIELD OF THE INVENTION

The present invention relates to positioning devices for positioning disk-like workpieces with respect to a processing tool to be applied to the workpiece. The present invention is particularly useful for centering semiconductor wafers with respect to a monitoring/metrology/inspection tool.

BACKGROUND OF THE INVENTION

It is often the case in the manufacture of various workpieces that the workpiece needs to be precisely positioned (registered) prior to being processed by a processing tool. For example, during the production of semiconductor devices, the semiconductor wafers progress on a production line being transported to various stations for processing, inspecting and the like procedures. During inspection/ measurement, it is essential that the semiconductor wafer, which is of circular disk shape, be precisely centered with the center of an inspection area defined by the inspection/ measurement tool.

One kind of conventional "centering" assembly for positioning disc-shaped workpieces comprises a support base formed with a chuck in the center region thereof, a pair of stops in a mutually confronting state, and a shifting mechanism for moving the stops in directions perpendicular to the direction of the entrance of the workpiece. The mutually confronting contact surfaces of the stops are concave and are of semi-circular shape with the curvature radius being equal to the radius of the workpiece to be processed. When a workpiece is fed to this centering mechanism and its center approaches the center of the chuck, the workpiece is contacted by the semi-circular contact surfaces of the stops approaching from their movable directions, and is thereby clamped and centered. In a conventional rotational processing device with the above-described centering mechanism, the radius of curvature of the semi-circular contact surfaces of the stops is of a certain fixed value corresponding to a predetermined workpiece type (i.e., diameter).

Another example of a conventional technique of the kind specified is disclosed in U.S. Pat. No. 5,171,031. This patent discloses an apparatus for fabricating a semiconductor device, utilizing a wafer rotating processing device provided with a centering assembly. The centering assembly comprises: a plurality of movable stops, which are disposed with even angular spacing around the center of a wafer chuck and are movable radially towards and away from that center to thereby clamp the periphery of a wafer conveyed onto the chuck and subsequently release the same. A plurality of pairs of wafer position sensors is disposed at spaced-apart positions in a single row along the path of advance of the wafer. The sensors of each pair are disposed on opposite sides of and equidistant from the chuck center, each sensor operating to detect whether or not a part of the wafer exists thereabove and to generate a corresponding output signal.

Yet another centering assembly was developed and is used in Integrated Thickness Monitor System NOVASCAN 420, commercially available from Nova Measurement System Ltd., Israel. This centering assembly comprises two supporting beams or jaws of concave and of semi-circular shape with a curvature radius equal to that of the wafer to be processed. The supporting beams are linearly movable toward and away from that center of the wafer and abut with the outer circumferential periphery of the wafer. While the supporting beams move towards their closest positions, they push the wafer between them. Since the center of the circle defined by the two supporting beams is aligned with the center of the measuring position, once supporting beams arrive at their final position, the center of the wafer will be at the desired location.

The above centering techniques have some drawbacks. These assemblies demand an additional footprint, and cannot be easily integrated within various processing tools. The mechanical drivers of registration members and registration members (stops or jaws) themselves occupy a large area and limit access to the working space therebetween. Since registration is provided by linear movement of the registration members, relatively complicated mechanical transmission is required. Furthermore, the sealing of linearly movable shafts is a difficult technical problem by itself.

SUMMARY OF THE INVENTION

There is accordingly a need in the art to facilitate precise positioning of a workpiece with respect to a processing tool, by providing a novel positioning assembly that provides a simple and effective solution for the above problems of the conventional devices of the kind specified.

It is a major feature of the present invention to provide a simple and reliable assembly for positioning a substantially disk-shaped workpiece in a registered position.

It is a further feature of the present invention to provide a positioning assembly, which can be readily retrofitted to existing machine tools.

It is a still further feature of the present invention to provide such an assembly that permits a convenient, quick and simple change-over from one diameter setting to another, being thereby readily adjustable to different sizes of workpieces.

The main idea of the present invention consists of the following. At least three spaced-apart guiding members are used to define a support plane for supportingly engaging the circumference of a workpiece at three spaced-apart locations. Each of the guiding members is mounted for pivotal movement between its two extreme positions in the support plane. The pivotal movement of the guiding members, when engaging the workpiece, results in pushing the latter until it reaches the desired position. The correct position of the workpiece corresponds to the tangential alignment of each of the members with respect to the circumference of the workpiece.

There is thus provided according to the present invention, a positioning assembly for positioning a substantially disk-shaped workpiece in a registered position, the assembly comprising at least three spaced-apart guiding members, which define a common support plane for supporting the work-piece and are capable of engaging the circumference of the workpiece at three spaced-apart locations, wherein each of said guiding members is mounted for pivotal movement in said support plane between its two extreme positions, the movements of the guiding members transport the workpiece towards said registered position.

The workpiece, when in the registered position thereof, is located within a working area of a processing tool, and the registered position is defined by the coincidence of an axis of the workpiece and a predefined location in this working area. The processing tool may be an inspection, metrology, monitoring or the like.

Preferably, each of the guiding members comprises a supporting portion and a guiding edge. The supporting surface is slightly inclined relative to the support plane, and engages the workpiece from below at a small segment of the workpiece circumference, while the guiding edge is substantially perpendicular to the support plane. The guiding edge may be such as to springingly support the circumference of the workpiece, for example, being in the form of a projection from the support portion.

Preferably, the length of the guiding member is variable, for example, it may be designed from two telescopically connected parts.

The positioning assembly may comprise at least three pairs of guiding members, the members of each pair being vertically aligned, so as to support two workpieces.

According to another aspect of the present invention, there is provided a processing tool for processing substantially disk-shaped workpieces, the processing tool being associated with a positioning assembly for positioning the workpiece in a registered position with respect to the processing tool, wherein the positioning assembly comprises at least three spaced-apart guiding members, which define a common support plane for supporting the workpiece and are capable of engaging the circumference of the workpiece at three spaced-apart locations, each of said guiding members being mounted for pivotal movement in said support plane between its two extreme positions, such that the movements of the guiding members transport the workpiece towards said registered position.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF A PREFERRED EMBODIMENT

Figure 1:
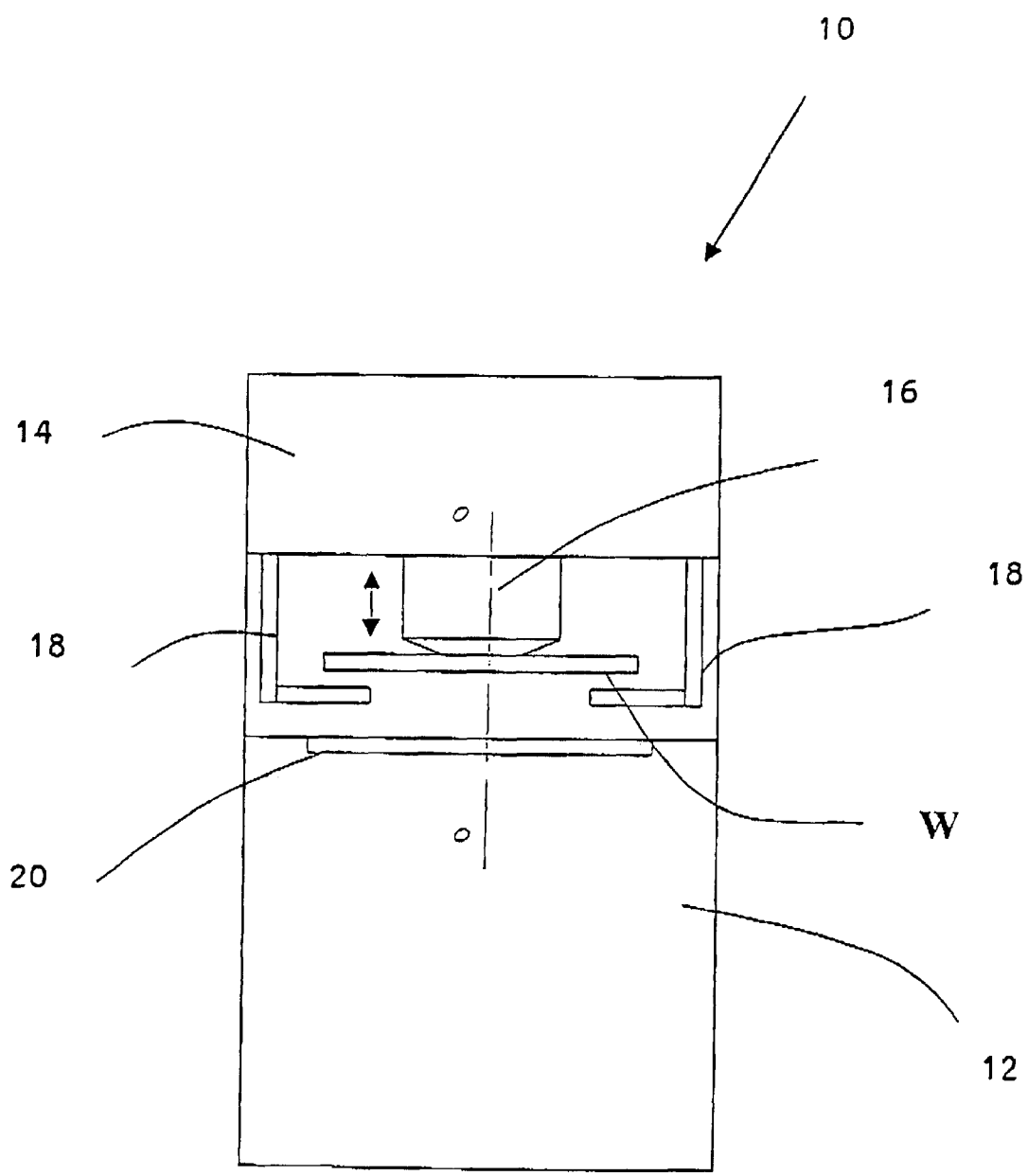
FIG. 1 is a schematic illustration of an inspection tool for inspecting a semiconductor wafer utilizing a positioning assembly according to the invention.

Referring to FIG. 1, there is illustrated an inspection tool 10 (constituting a processing tool) to be applied to a semiconductor wafer W (constituting a substantially disk-shaped workpiece). This may be any station in the semiconductors' manufacture, for example, the Integrated Thickness Monitoring (ITM) System called Imetra-P, commercially available from Nova Measurement System Ltd., Israel.

The present invention will be described below with respect to the ITM, which measures the thicknesses of the wafer's layers, as an exemplary embodiment only. It will be appreciated that the principles of the present invention can be implemented in any processing tool, which demand the registration of disk-shaped workpieces.

In general, the inspection tool 10 comprises an optical measurement system 12, a loading unit 14 having a gripper 16 and a positioning assembly 18 installed within the loading unit 14. If the optical measurement system 12 observes the wafer from below, as in the Imetra-P, an optical window 20 is appropriately provided.

The wafer W is brought to the station by a robotic arm (not shown), registered (centered) by the positioning assembly 18, and conveyed to the measurement position by the gripper 16, which, while holding the wafer W, e.g., by vacuum chuck (not shown), moves it along a vertical axis, so as to maintain it registered with respect to the measurement position. The gripper may and may not continue holding the wafer during the inspection. In the present example, the gripper 16 holds the wafer in a water bath at a predetermined height above the optical window 20.

Figure 2:
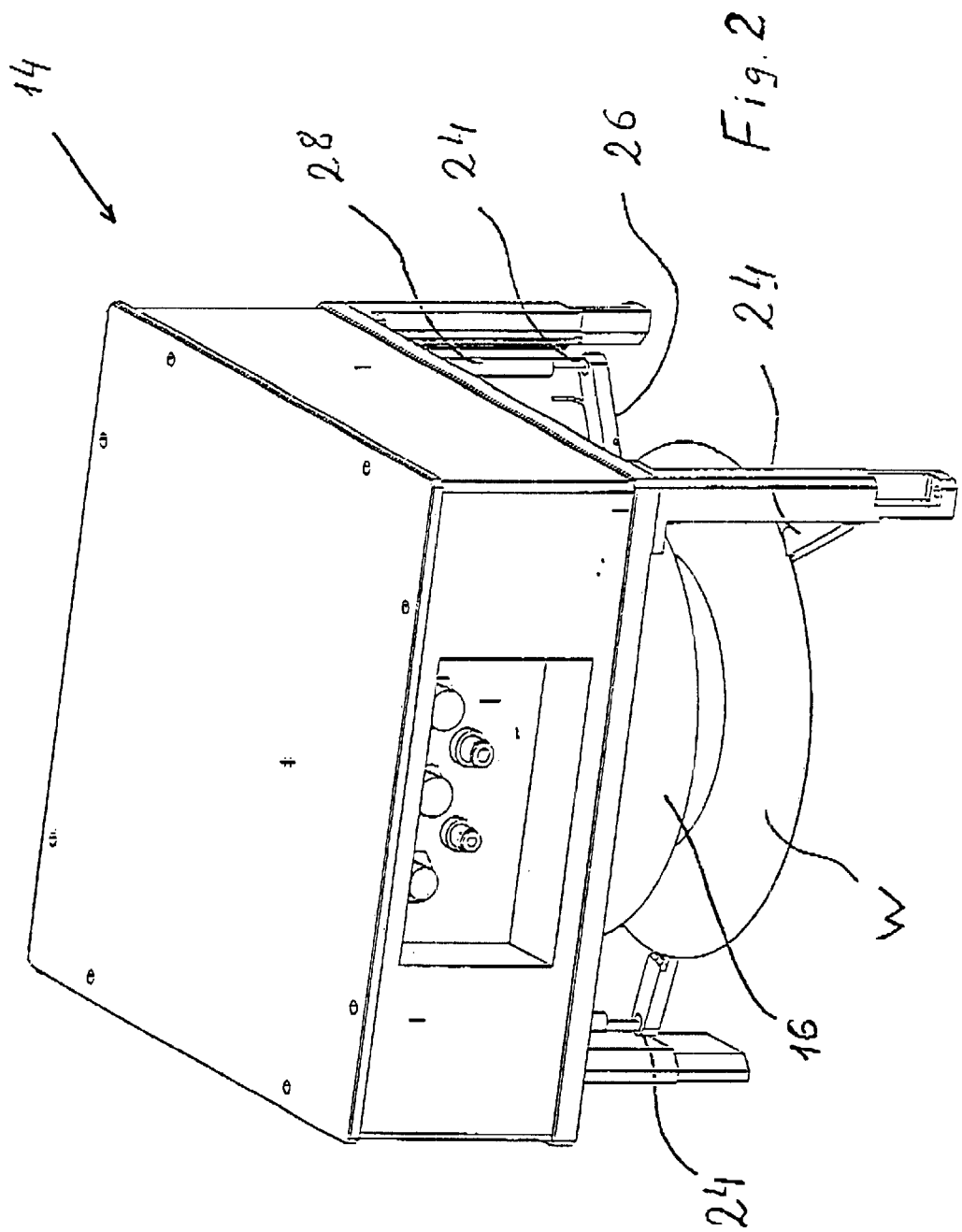
FIG. 2 more specifically illustrates the positioning assembly of FIG. 1 integrated with a loading unit.

The positioning assembly 18 is more specifically shown in FIG. 2. In the present example, the positioning assembly 18 is integrated with the loading unit 14 and configured to precisely position the semiconductor wafer W, such that its center coincides with an axis (not shown) of the optical measurement system 12 (FIG. 1) and the gripper 16. The positioning assembly 18 includes at least three guiding members, generally at 24, arranged around the center of the holder 16 at arbitrary angular spacing intervals.

Figure 3:
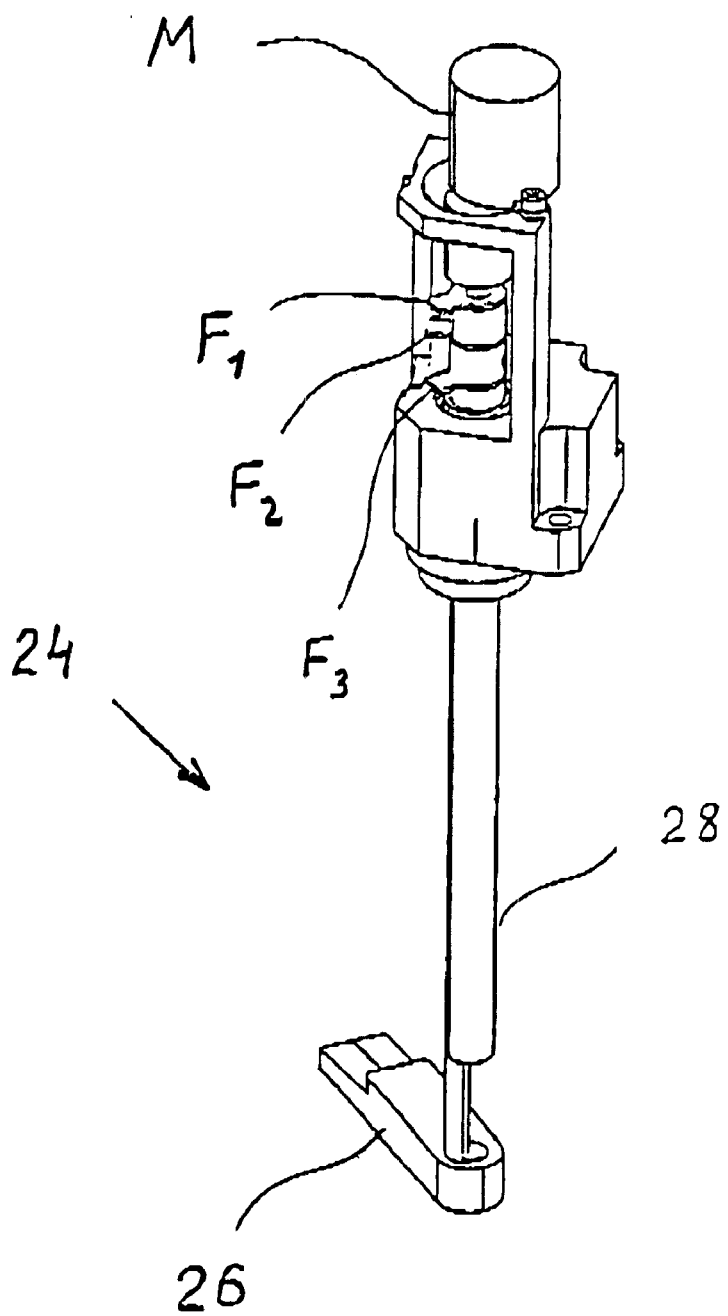
FIG. 3 is a schematic illustration of one of guiding members of the positioning assembly.

As illustrated in FIG. 3, each positioning member 24 is of L-shaped form and comprises a pivotal arm 26 pivotal about a vertical shaft 28. Thus, pivotal arms 26 of guiding members 24 are mounted for pivotal movement within a substantially horizontal plane, and, when engaging the workpiece, move it towards the desired position.

The shaft 28 is connected to a suitable driver, for example, a stepper motor M (see FIG. 3), so as to be turned into desired position. The stepper motor is accommodated inside the housing of the loading unit 14, and the vertical shaft is appropriately sealed. To this end, although not specifically shown, a sensor is provided for controlling the turning of the positioning member 24. For example, a photo-coupler could be used being disposed in the vicinity of the shaft 28 in such a manner that its light-emitting section and light receiving section are opposed to each other with three shutters $F_1$, $F_2$ and $F_3$ interposed therebetween. The photo-coupler detects the position of the positioning member 24 by detecting the light passage or interruption of light between the light-emitting and receiving sections with the shutters $F_1$, $F_2$ and $F_3$. Shutters $F_1$, $F_2$ and $F_3$ have appropriate angle orientation so as to provide three operational positions shown in FIGS. 7A–7C. Any other position detection means may be used for the same purposes, e.g., micro-switches.

Figure 4:
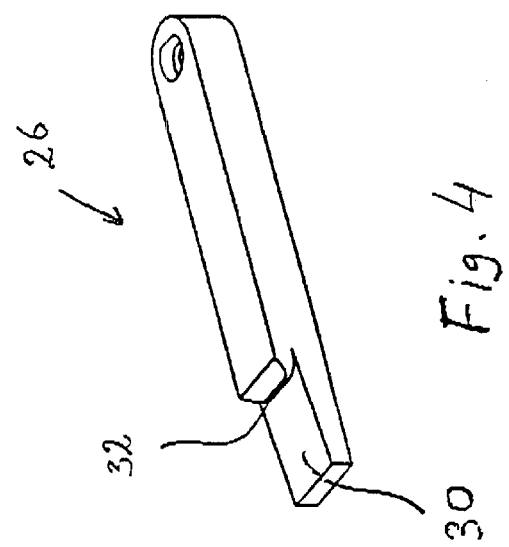
FIG. 4 more specifically illustrates a pivotal arm of the guiding member.
Figure 6:
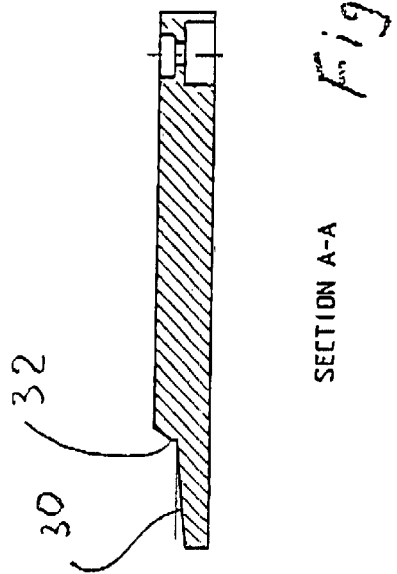
FIG. 6 is a section taken along the line A—A of FIG. 5.
Figure 5:
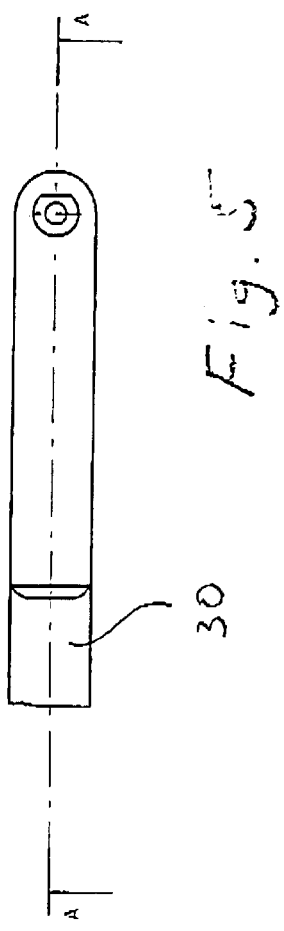
FIG. 5 is a top view of the pivotal arm of FIG. 4.

FIGS. 4–6 more specifically illustrate the pivotal arm 26. The pivotal arm 26 is formed with an inclined (sloping) supporting surface 30 and a substantially vertical guiding edge 32. The supporting surface 30 is inclined towards the center of the wafer (not shown), so as to provide minimal contact with the wafer's surface. Preferably, the supporting surface 30 makes an angle of about 5° with the horizontal plane. The guiding edge 32 could be slightly rounded as shown in FIGS. 4 and 5.

In the preferred embodiment of the invention, the pivotal arms 26 are made of a plastic material, for example, that known under the trade name white "Ertalyte". It should, however, be noted that other materials can be used, provided they are characterized by strong durability, good resistance to soiling and corrosion resistance in a polishing slurry, and, when engaging the workpiece (wafer), provide sufficient sliding thereof along the supporting surface 30.

Figure 7A:
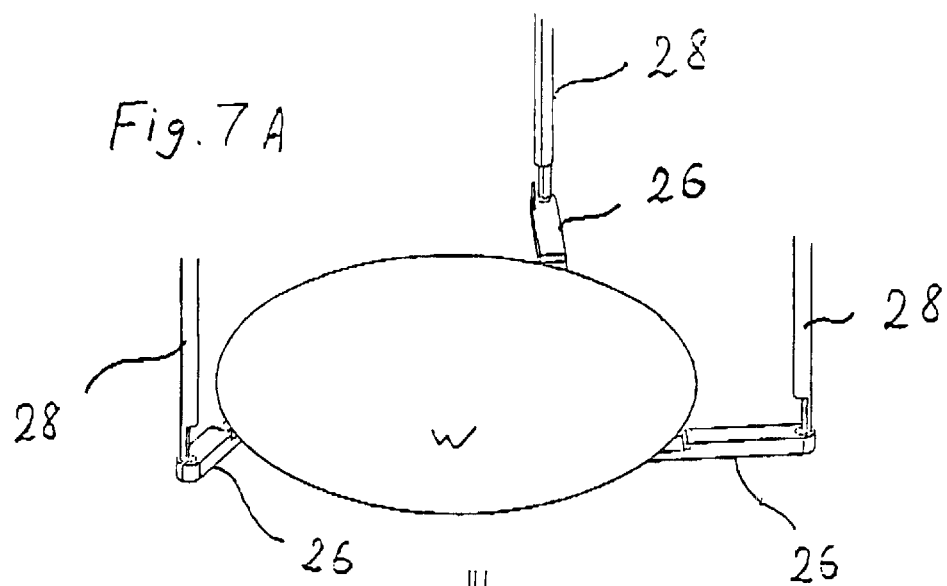
FIGS. 7A to 7C illustrate the operation of the positioning assembly of FIG. 2.
Figure 7B:
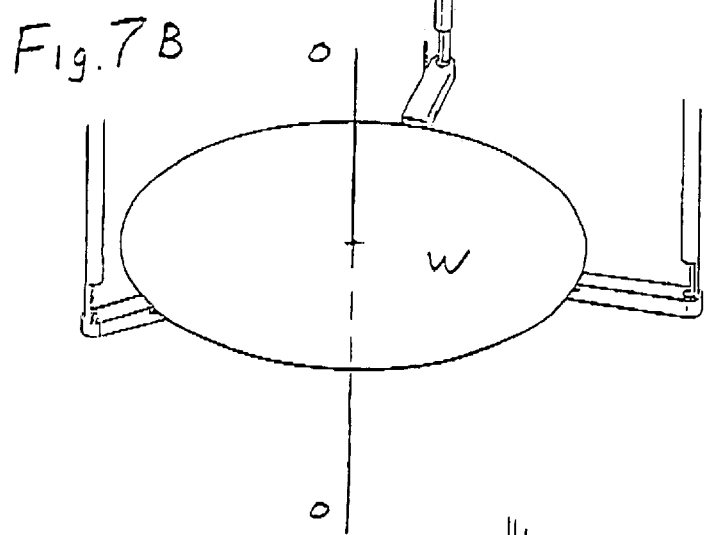
Figure 7C:
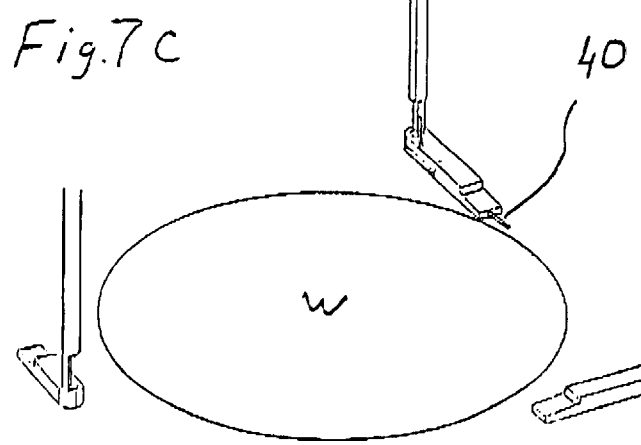

Turning now to FIGS. 7A–7C, there are illustrated three operational steps, respectively, in the operation of the positioning assembly 18 for centering the wafer W. The wafer W is supplied towards the positioning assembly by a wafer conveyor system or robot (not shown). When the center region of the wafer W approaches the vicinity of the center region of the positioning assembly 18, the wafer is loaded onto the pivotal arms 26 of the guiding members 24. As shown in FIG. 7A, at this initial stage, the pivotal arms 26 are in their "semi-closed" operational position.

The stepper motors (not shown here) operate together to turn the guiding members 24 inwardly against the wafer W. The latter slides along the supporting surface 30 (being slightly lifted due to the inclined design of the surfaces 30) until its circumference contacts the guiding edges 32. The stepper motors continue to rotate the guiding members 24 inwardly, the guiding edges 32 thereby sliding along the circumference of the wafer W.

By turning the guiding members 24 inwardly, the guiding edges 32 move in radial direction towards the axis of the positioning assembly 18 coinciding with the axis O-O of the optical measurement system 12 and gripper 16. The guiding edges 32 thus contact the circumference of the wafer W and press against it, thus causing the wafer to move towards the center of the positioning assembly 18. The guiding members 24 are turned until the guiding edges 32 reach their extreme, "closed" position, being disposed on the curvature of the circle with the radius equal to one half of the outer diameter of the wafer W. FIG. 7B illustrates such closed position of the guiding members 24, when the center of the wafer W is aligned with the center of the measuring position.

At the next stage, which is not shown here, the gripper moves down and grabs the wafer W, while in the centered position of the latter. While the gripper 16 holds the wafer W, the positioning members 24 are turned outwardly towards their extreme "opened" position, thereby and releasing the wafer W, as shown in FIG. 7C. An optical sensor 40 (or a similar device) is optionally provided, being interposed within the positioning assembly 18 to detect that the wafer W is properly located and/or supported by the guiding members 24.

The gripper 16 moves down until it is positioned at a predetermined height above the optical window 20, thereby allowing for the processing of the wafer (i.e., measurement of the layers thickness in the present example). After being measured, the wafer W is moved away from the measuring location and is loaded by the gripper 16 onto the guiding members 24, which are in their "semi-closed" position at that stage. Then, the wafer W can be unloaded from guiding members 24 by any suitable means, for example the same robot, and conveyed away from the station.

It will be readily appreciated that the positioning assembly 18 can comprise more than three guiding members 24.

Figure 8:
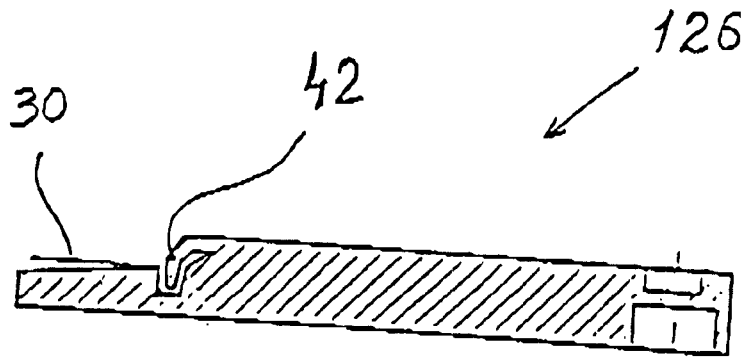
FIGS. 8 and 9 are cross-sectional views of the pivotal arm according to two more embodiments of the invention.

If required for high accuracy of positioning, the guiding edge can be made springing. This concept is illustrated in FIG. 8. As shown, a pivotal arm 126 is formed with a flexible projection 42, thereby making the guiding edge springing.

Figure 9:
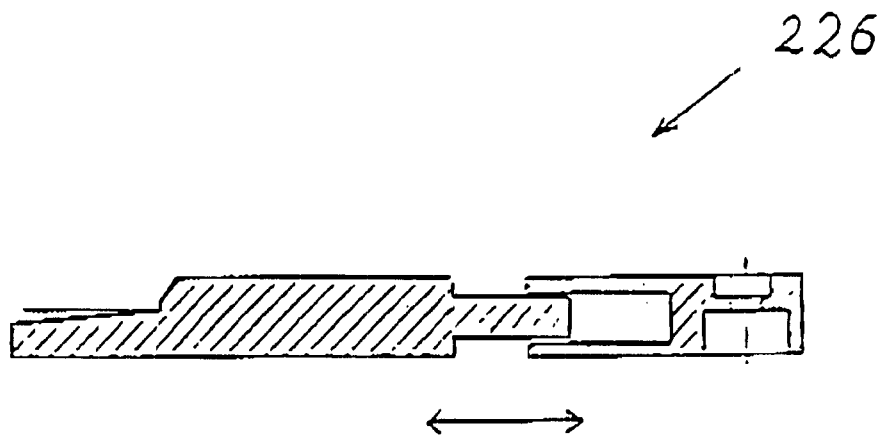

FIG. 9 illustrates another embodiment of a pivotal arm 226, which is generally similar to the above-described example, but has a variable length design. This is implemented, for example, by telescopic construction, as shown in the figure in a self-explanatory manner. Such a construction permits readily adjustment of the positioning assembly to different sizes (diameters) of workpieces.

Figure 10:
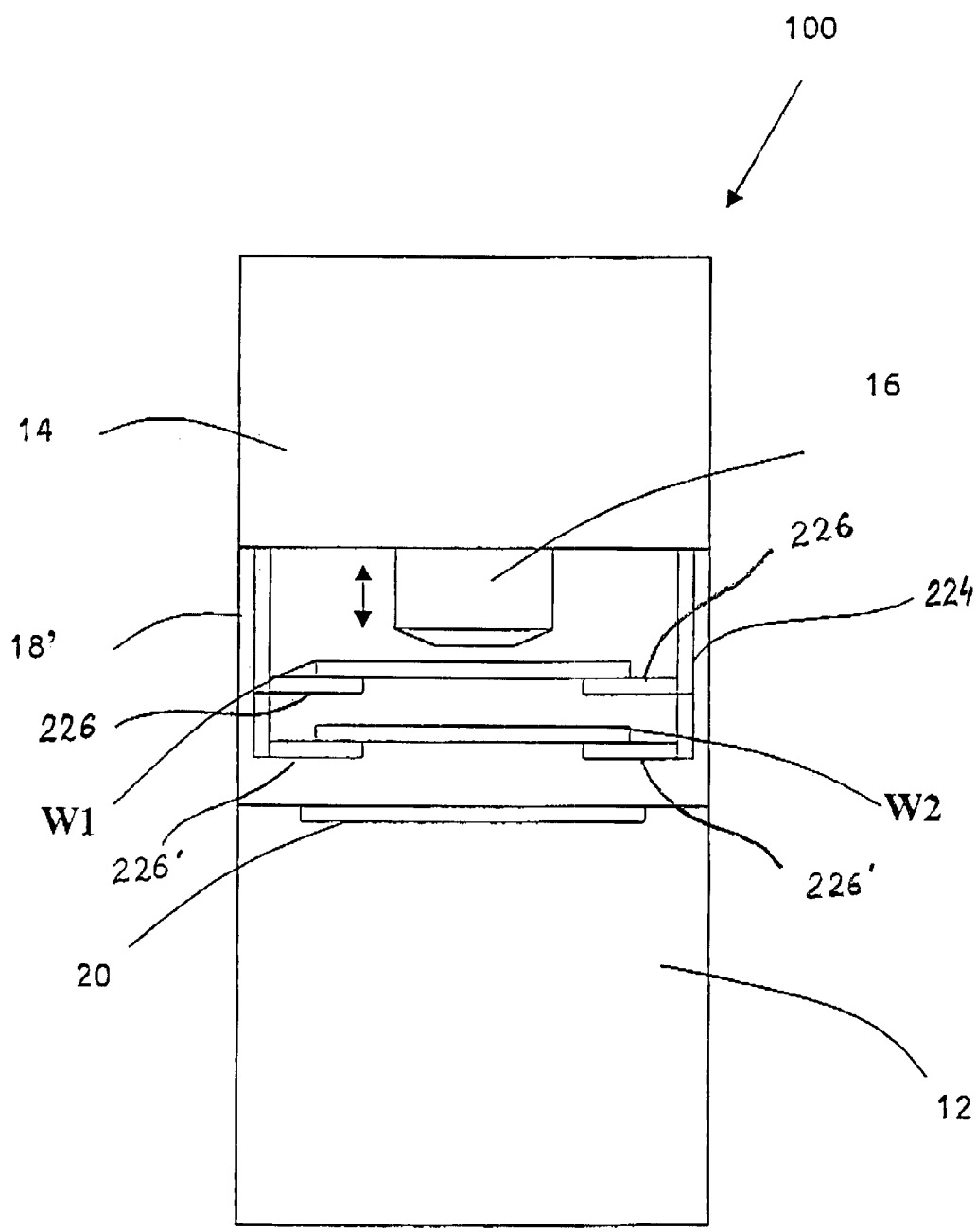
FIG. 10 is a schematic illustration of an inspection tool including a positioning assembly constructed in according to another embodiment of the invention.
Figure 11:
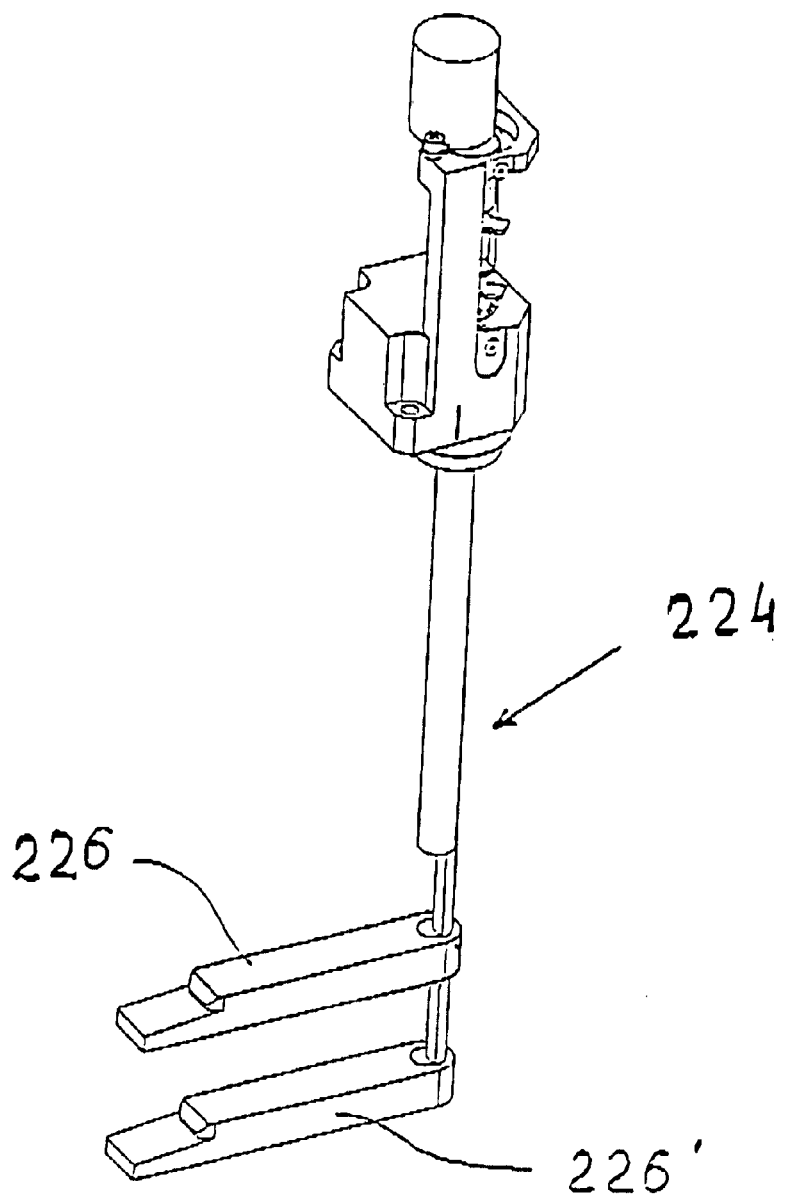
FIG. 11 more specifically illustrates a guiding member of the positioning assembly of FIG. 10.

FIGS. 10 and 11 illustrate some additional features of the present invention. FIG. 10 illustrates an inspection station 100, designed generally similar to that of FIG. 1, but has a somewhat different design of a positioning assembly 18'. The assembly 18' comprises three guiding members 224 (only two of them being seen in FIG. 10), each having two pivotal arms 226 and 226', rather than a single pivotal arm as in the previously described examples. The arms 226 and 226' are vertically aligned in a spaced-apart parallel relationship, being pivotal about the common axis. This design enables to buffer wafers $W_1$ and $W_2$, in such a manner that a standard single-armed robot can arrive with a new wafer to be processed (e.g., $W_1$) and can return with the processed wafer (e.g., $W_2$), rather than performing an "idle" path while returning empty.

As illustrated in FIG. 10, the processed wafer $W_2$ is loaded onto the lower pivotal arms 226', and the wafer $W_1$ to be measured (processed) is loaded onto the upper pivotal arms 226. From this point, a robot (not shown) and gripper 16 can independently operate. They grab the wafers, and the guiding members 224 of the positioning assembly 18' are turned into their "open" positions, thereby releasing the wafers. At the next stage, the robot leaves the inspection station 100 with the processed wafer $W_2$, while the gripper 16 moves down with the wafer $W_1$ towards the measuring window 20. While the wafer $W_1$ is processed (inspected in the present example), the robot unloads the wafer $W_2$, grabs a new wafer (not shown) to be processed, and returns to the inspection station 100. At the next stage, the gripper 16 moves upwardly and loads the processed wafer $W_2$ onto the lower pivotal arms 226'. Then, the robot supplies the wafer to be processed to the positioning system, and loads the wafer to be processed onto the upper pivotal arms. It should be noted, although not specifically shown, that the pivotal arms 226 and 226' may be turned independently by separate motors via separate shafts.

A convenient, quick and simple change-over from one diameter setting to another can be provided by preparing a set of pivotal arms with different lengths, and selecting the appropriate pivotal arms to be mounted. The positioning assembly 18 (or 18') can be incorporated into a machine tool for processing the top or bottom surface of the workpiece with the gripper holding the workpiece from below or from the top, respectively. In this respect, the positioning assembly may be mounted on the loading unit or on the machine tool itself. The positioning assembly according to the invention can be manufactured, assembled and maintained in a relatively economical, simple manner so as to lead to lower costs.

Those skilled in the art will readily appreciate that various modifications and changes can be applied to the preferred embodiments of the invention as hereinbefore exemplified without departing from its scope defined in and by the appended claims.

What is claimed is:

1. A positioning assembly for positioning a substantially disk-shaped workpiece in a registered position, the assembly comprising at least three spaced-apart guiding members, which define a common support plane for supporting the workpiece and are capable of engaging the circumference of the workpiece at three spaced-apart locations, wherein each of said guiding members is mounted for pivotal movement in said support plane between its two extreme positions, the movements of the guiding members transport the workpiece towards said registered position, each of said guiding members comprising at least two supporting surfaces vertically aligned in a spaced-apart parallel relationship and at least two guiding edges, each inclined relative to the respective supporting surface and being capable of engaging the circumference of the workpiece.

2. The assembly according to claim 1, wherein said desired location of the workpiece is located within a working area of a processing tool, said registered position is defined by the coincidence of an axis of the workpiece and an axis defined by said working area.

3. The assembly according to claim 2, wherein said processing tool is an inspection machine defining an inspection plane.

4. The assembly according to claim 3, wherein said common support plane is located within said inspection plane.

5. The assembly according to claim 3, wherein said common support plane is parallel to said inspection plane.

6. The assembly according to claim 1, wherein said supporting surface is inclined relative to a horizontal plane.

7. The assembly according to claim 6, wherein the guiding edge is made springy relative to the edge of the workpiece contacting the guiding edge.

8. The assembly according to claim 7, wherein the springing guiding edge is in a form of projection.

9. The assembly according to claim 1, wherein the guiding members have adjustable lengths along the supporting plane.

10. A processing tool for processing substantially disk-shaped workpieces, the processing tool being associated with a positioning assembly for positioning the workpiece in a registered position with respect to the processing tool, wherein the positioning assembly comprises at least three spaced-apart guiding members, which define a common support plane for supporting the workpiece and are capable of engaging the circumference of the workpiece at three spaced-apart locations, each of said guiding members being mounted for pivotal movement in said support plane between its two extreme positions, such that the movements of the guiding members transport the workpiece towards said registered position, each of said guiding members comprising at least two supporting surfaces vertically aligned in a spaced-apart parallel relationship and at least two guiding edges, each inclined relative to the respective supporting surface and being capable of engaging the circumference of the workpiece.

* * * * *